United States Patent
Hwang et al.

(10) Patent No.: US 12,180,637 B2
(45) Date of Patent: Dec. 31, 2024

(54) LAUNDRY TREATING APPARATUS

(71) Applicant: LG Electronics Inc., Seoul (KR)

(72) Inventors: Sangwook Hwang, Seoul (KR); Jinhwan Son, Seoul (KR)

(73) Assignee: LG Electronics Inc., Seoul (KR)

( * ) Notice: Subject to any disclaimer, the term of this patent is extended or adjusted under 35 U.S.C. 154(b) by 684 days.

(21) Appl. No.: 17/508,448

(22) Filed: Oct. 22, 2021

(65) Prior Publication Data
US 2022/0127774 A1 Apr. 28, 2022

(30) Foreign Application Priority Data
Oct. 23, 2020 (KR) .................. 10-2020-0138227

(51) Int. Cl.
*D06F 34/30* (2020.01)
*D06F 34/08* (2020.01)
(Continued)

(52) U.S. Cl.
CPC .............. *D06F 34/30* (2020.02); *D06F 34/08* (2020.02); *D06F 39/14* (2013.01); *D06F 58/04* (2013.01);
(Continued)

(58) Field of Classification Search
CPC .......... D06F 34/34; D06F 34/08; D06F 39/14; D06F 58/04; H01H 13/14; H01H 13/20; H01H 2335/01
(Continued)

(56) References Cited

U.S. PATENT DOCUMENTS 5,062,219 A * 11/1991 Harris .................. F26B 11/028
34/609
6,941,679 B1 * 9/2005 Harris ..................... D06F 37/42
34/601
(Continued)

FOREIGN PATENT DOCUMENTS

CN 106149302 11/2016
CN 106471176 3/2017
(Continued)

OTHER PUBLICATIONS

Office Action in Chinese Appln. No. 202111215097.4, dated Apr. 13, 2023, 13 pages (with English translation).

*Primary Examiner* — Stephen M Gravini
(74) *Attorney, Agent, or Firm* — Fish & Richardson P.C.

(57) ABSTRACT

A laundry treating apparatus includes a cabinet for forming an appearance of the laundry treating apparatus, wherein the cabinet has a laundry inlet defined therein, a drum disposed inside the cabinet, wherein a drum opening in communication with the laundry inlet is defined in the drum, wherein the drum accommodates laundry therein, and a control unit disposed in the cabinet to receive a control signal. The control unit includes a touch portion for forming an exposed surface outwardly of the cabinet, a circuit board spaced apart from the touch portion and positioned inside the cabinet, and a spring unit having a portion on one side in contact with the touch portion and a portion on an opposite side coupled to the circuit to connect the touch portion and the circuit to each other. The spring unit transmits an electrical signal input through the touch portion to the circuit board.

20 Claims, 6 Drawing Sheets

(51) Int. Cl.
*D06F 39/14* (2006.01)
*D06F 58/04* (2006.01)
*H01H 13/14* (2006.01)
*H01H 13/20* (2006.01)

(52) U.S. Cl.
CPC ............ H01H 13/14 (2013.01); H01H 13/20 (2013.01); *H01H 2235/01* (2013.01)

(58) Field of Classification Search
USPC .......................................................... 34/201
See application file for complete search history.

(56) References Cited

U.S. PATENT DOCUMENTS

| | | | | |
|---|---|---|---|---|
| 8,627,581 B2 * | 1/2014 | Brown | ................... | D06F 58/20 34/607 |
| 10,487,437 B2 * | 11/2019 | Kim | ........................ | G06F 3/01 |
| 11,655,584 B2 * | 5/2023 | Reeves | ................... | D06F 58/50 34/89 |
| 11,692,295 B2 * | 7/2023 | Leibman | ................. | D06F 37/42 68/12.18 |
| 11,692,299 B2 * | 7/2023 | Salameh | ................. | D06F 34/05 34/528 |
| 11,773,531 B2 * | 10/2023 | Cook, IV | ................ | D06F 58/46 34/491 |
| 11,946,195 B1 * | 4/2024 | Petrie | ...................... | D06F 33/32 |
| 2005/0132759 A1 * | 6/2005 | Guinibert | ............... | D06F 58/04 68/210 |
| 2016/0138208 A1 * | 5/2016 | Bison | ...................... | D06F 58/20 34/131 |
| 2022/0127774 A1 * | 4/2022 | Hwang | ................... | D06F 39/14 |
| 2024/0093421 A1 * | 3/2024 | Borgerson | .............. | D06F 58/04 |

FOREIGN PATENT DOCUMENTS

| | | | | | |
|---|---|---|---|---|---|
| CN | 109923259 | | 6/2019 | | |
| CN | 209844935 | | 12/2019 | | |
| CN | 211142545 | | 7/2020 | | |
| CN | 114481552 | A * | 5/2022 | ............ | D06F 34/08 |
| EP | 3176298 | A1 * | 6/2017 | ............ | D06F 33/00 |
| JP | 2016-220719 | | 12/2016 | | |
| JP | 2020-078478 | | 5/2020 | | |
| KR | 10-2020-0089808 | | 7/2020 | | |
| KR | 20220053904 | A * | 5/2022 | | |
| WO | WO 2013/064572 | | 5/2013 | | |
| WO | WO-2016017925 | A1 * | 2/2016 | ............ | D06F 33/00 |

* cited by examiner

LAUNDRY TREATING APPARATUS

CROSS-REFERENCE TO RELATED APPLICATIONS

This application claims the benefit of Korean Patent Application No. 10-2020-0138227, filed on Oct. 23, 2020, which is hereby incorporated by reference as if fully set forth herein.

TECHNICAL FIELD

The present disclosure relates to a laundry treating apparatus. More particularly, the present disclosure relates to a laundry treating apparatus including a control unit for improving durability and conductivity by applying a spring-shaped member of a conductive and elastic metal material in close contact with a rear surface of a touch panel of the laundry treating apparatus.

BACKGROUND

In general, a laundry treating apparatus refers to an apparatus capable of washing, drying, or washing or drying laundry. In this connection, the laundry treating apparatus may perform only a washing or drying function, or both the washing and drying functions. In addition, in recent years, a washing machine equipped with a steam supply to have a refresh function such as removing wrinkles, removing odors, removing static electricity, and the like of the laundry has been popularized.

In one example, conventional laundry treating apparatuses are classified into a front load type laundry treating apparatus and a top load type laundry treating apparatus based on a withdrawing direction of the laundry. A representative example of such a horizontal type is a drum washing machine or a drum dryer.

The front load type laundry treating apparatus refers to a laundry treating apparatus having an opening defined in a front surface thereof, and having a rotation shaft of a drum being parallel to the ground or having a certain inclination. The top load type laundry treating apparatus refers to a laundry treating apparatus having the opening defined at a top surface thereof, and having the rotation shaft of the drum being perpendicular to the ground.

In such laundry treating apparatus, a plurality of courses and options for performing a washing cycle for removing foreign substances from the laundry or a drying cycle for removing moisture from the laundry are preset. Accordingly, a user may wash or dry the laundry by specifying desired specific course and option among the plurality of courses and options.

The user may use a control unit when setting the specific course or option as such. In addition, the control unit may be composed of a touch panel, and used in a scheme in which the user touches the control unit with a finger thereof without controlling a physical button.

A related document CN201323564Y discloses a touch control unit capable of sensing a touch by transferring a change in capacitance occurred when a touch panel is touched to a circuit using a metal spring.

Figure 1:
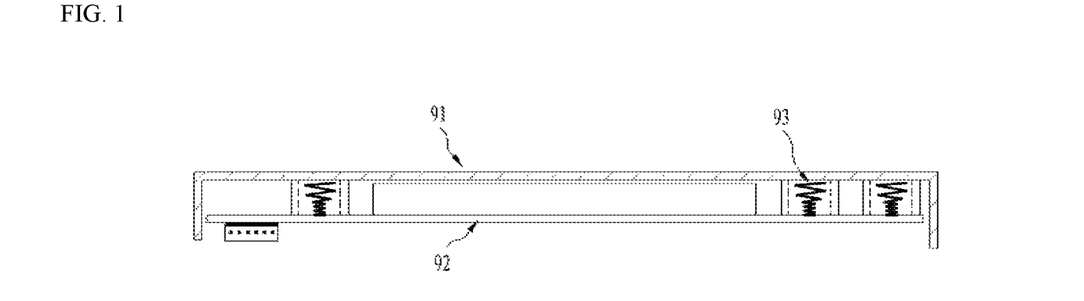
FIG. 1 shows a structure of a touch panel according to the prior literature.
Figure 2:
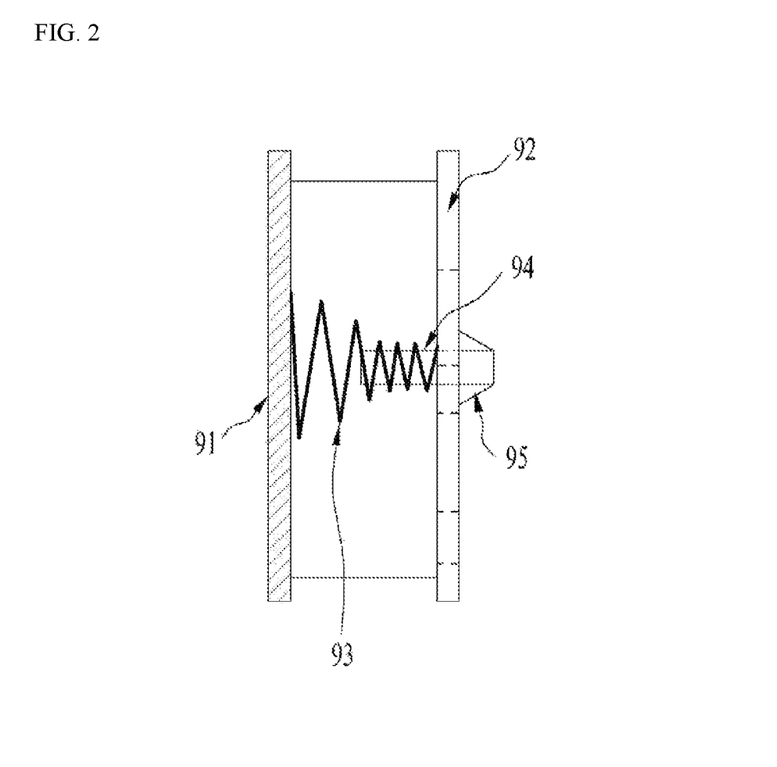
FIG. 2 is an enlarged cross-sectional view of a spring structure of a touch panel according to the prior art.

FIG. 1 shows an internal structure of a touch device disclosed in the prior literature, and FIG. 2 is an enlarged view of a spring of a configuration of FIG. 1. Referring to FIGS. 1 and 2, in the touch control unit disclosed in the prior literature, a metal spring 93 is disposed between a touch panel 91 and a circuit 92, and a diameter of the spring 93 increases from the circuit 92 to the touch panel 91. In addition, a metal rivet 94 is inserted into the circuit 92, and the touch panel 91 and the circuit 92 are electrically coupled in such a way that the metal rivet 94 penetrates the spring 93. In addition, the metal rivet 94 is coupled to the circuit 92 using a coupling body 95 such as soldering on a surface of circuit 92 opposite to a surface to which the spring 93 is contacted. As shown in FIGS. 1 and 2, the touch panel 91 and the circuit 92 are not electrically coupled to each other through a single structure of the spring 93, but are coupled and fixed to each other through a double structure of the spring 93 and the metal rivet 94.

SUMMARY

Embodiments of the present disclosure are to provide a laundry treating apparatus equipped with a control unit that may implement more touch buttons by changing a structure of a spring located between a touch panel and a PCB to increase a contact density of the touch panel and the spring in a single area.

In addition, embodiments of the present disclosure are to provide a laundry treating apparatus equipped with a control unit having a spring whose diameter decreases toward a touch panel.

In addition, embodiments of the present disclosure are to provide a laundry treating apparatus equipped with a control unit that may use both flow and reflow schemes to fix a spring to a PCB.

In addition, embodiments of the present disclosure are to provide a laundry treating apparatus equipped with a control unit that may connect a touch panel and a PCB to each other with a spring of an integrated shape.

In addition, embodiments of the present disclosure are to provide a laundry treating apparatus equipped with a control unit including a spring that may electrically connect a touch panel and a PCB to each other in a structurally stable manner.

One embodiment of the present disclosure connects a touch panel and a PCB substrate to each other with a spring of a single structure without connecting the touch panel and the PCB substrate to each other through a double structure composed of a rivet and the spring in order to solve the above problems. Thus, it is possible to improve accuracy and stability of a touch by increasing contact reliability of the spring.

An upper portion of the spring may be formed in a structure in which a diameter thereof decreases toward the touch panel in order to increase a contact area with the touch panel. Thus, the spring with a greater area may be stably in contact with the touch panel.

A lower portion of the spring may be inserted into a through-hole defined in the PCB substrate to be stably in contact with the PCB substrate. The spring and a rear surface of the PCB substrate may fixed through a flow process, and a front surface of the PCB substrate may be fixed through a reflow process. The lower portion of the spring may be formed to have a diameter equal to or smaller than a diameter of the through-hole of the PCB to facilitate the flow fixing, and may have a length equal to or larger than a thickness of the PCB.

The spring may be manufactured using SUS-based metal to prevent corrosion, and may have an integrated structure without physical bonding to prevent contact failure.

According to an aspect of the present disclosure, provided is a laundry treating apparatus including a cabinet for forming an appearance of the laundry treating apparatus, wherein the cabinet has a laundry inlet defined therein, a drum disposed inside the cabinet, wherein a drum opening in communication with the laundry inlet is defined in the drum, wherein the drum accommodates laundry therein, and a control unit disposed in the cabinet to receive a input signal, wherein the control unit includes touch portion for forming an exposed surface outwardly of the cabinet, a circuit spaced apart from the touch portion and positioned inside the cabinet, and a spring unit having a portion on one side in contact with the touch portion and a portion on an opposite side coupled to the circuit to connect the touch portion and the circuit to each other, wherein the spring unit transmits an electrical signal input through the touch portion to the circuit.

In one implementation, the spring unit may include a touch spring in contact with the touch portion, a circuit spring coupled to the circuit, and a connection spring for connecting the touch spring and the circuit spring to each other, and diameters of the touch spring and the circuit spring may be equal to or smaller than a diameter of the connection spring.

In one implementation, the laundry treating apparatus may further include a circuit through-hole penetrating the circuit, wherein the spring unit is coupled to the circuit through-hole, and the circuit spring may be inserted into and fixed in the circuit through-hole.

In one implementation, the touch spring may extend in a helix shape in a direction away from the circuit spring from the connection spring, and the diameter of the touch spring may decrease as the touch spring extends.

In one implementation, the touch spring may be formed by a second spring wire extending from a first spring wire forming the connection spring and forming the helix shape, and portions of the second spring wire adjacent to each other in a radial direction of the touch spring may be spaced apart from each other in the radial direction of the touch spring.

In one implementation, the second spring wire may be constructed such that an entirety of one surface of the second spring wire facing the touch portion is able to be in contact with the touch portion when the second spring wire is compressed by the touch portion.

In one implementation, the circuit spring may include a contact spring extending in a helix shape from the connection spring in a direction away from the touch spring, wherein a diameter of the contact spring decreases as the contact spring extends, wherein the contact spring is in contact with the circuit, and an insertion spring extending from the contact spring in the direction away from the touch spring, wherein the insertion spring is inserted into and fixed in the circuit through-hole.

In one implementation, the contact spring may be formed by a third spring wire extending from a first spring wire forming the connection spring and forming the helix shape, and portions of the third spring wire adjacent to each other in a radial direction of the contact spring may be spaced apart from each other in the radial direction of the contact spring.

In one implementation, a diameter of the insertion spring may be equal to or smaller than a diameter of the circuit through-hole, and a height of the insertion spring may be equal to or greater than a depth of the circuit through-hole.

In one implementation, the third spring wire may be constructed such that an entirety of one surface of the third spring wire facing the circuit is able to be in contact with the circuit when the third spring wire is compressed by the circuit.

In one implementation, the contact spring may be fixed to be in contact with the circuit, and the insertion spring may be fixed by being inserted into the circuit through-hole.

In one implementation, the connection spring may connect the touch spring and the circuit spring to each other while maintains the same diameter.

Embodiments of the present disclosure may provide the laundry treating apparatus equipped with the control unit that may implement more touch buttons by changing the structure of the spring located between the touch panel and the PCB to increase the contact density of the touch panel and the spring in the single area.

In addition, embodiments of the present disclosure may provide the laundry treating apparatus equipped with the control unit having the spring whose diameter decreases toward the touch panel.

In addition, embodiments of the present disclosure may provide the laundry treating apparatus equipped with the control unit that may use both the flow and reflow schemes to fix the spring to the PCB.

In addition, embodiments of the present disclosure may provide the laundry treating apparatus equipped with the control unit that may connect the touch panel and the PCB to each other with the spring of the integrated shape.

In addition, embodiments of the present disclosure may provide the laundry treating apparatus equipped with the control unit including the spring that may electrically connect the touch panel and the PCB to each other in the structurally stable manner.

DETAILED DESCRIPTION

Hereinafter, with reference to the accompanying drawings, an embodiment of the present disclosure will be described in detail to be easily implemented by a person with ordinary skill in the technical field to which the present disclosure belongs.

However, the present disclosure may be implemented in several different forms and may not be limited to the embodiment described herein. In addition, in order to clearly illustrate the present disclosure in the drawings, portions irrelevant to the description are omitted, and like reference numerals are assigned to like portions throughout the specification.

In this specification, duplicate descriptions of the same components will be omitted.

In addition, it will be understood that when a component is referred to as being 'connected to' or 'coupled to' another component herein, it may be directly connected to or coupled to the other component, or one or more intervening components may be present. On the other hand, it will be understood that when a component is referred to as being 'directly connected to' or 'directly coupled to' another component herein, there are no other intervening components.

In addition, the terminology used in this specification is only used to describe a specific embodiment, and is not intended to limit the present disclosure.

In addition, in this specification, the singular expression may include the plural expression unless the context clearly dictates otherwise.

It should be understood that the terms 'comprises', 'comprising', 'includes', and 'including' when used herein, specify the presence of the features, numbers, steps, operations, components, parts, or combinations thereof described herein, but do not preclude the presence or addition of one or more other features, numbers, steps, operations, components, or combinations thereof.

In addition, in this specification, the term 'and/or' includes a combination of a plurality of listed items or any of the plurality of listed items. In the present specification, 'A or B' may include 'A', 'B', or 'both A and B'.

Figure 3:
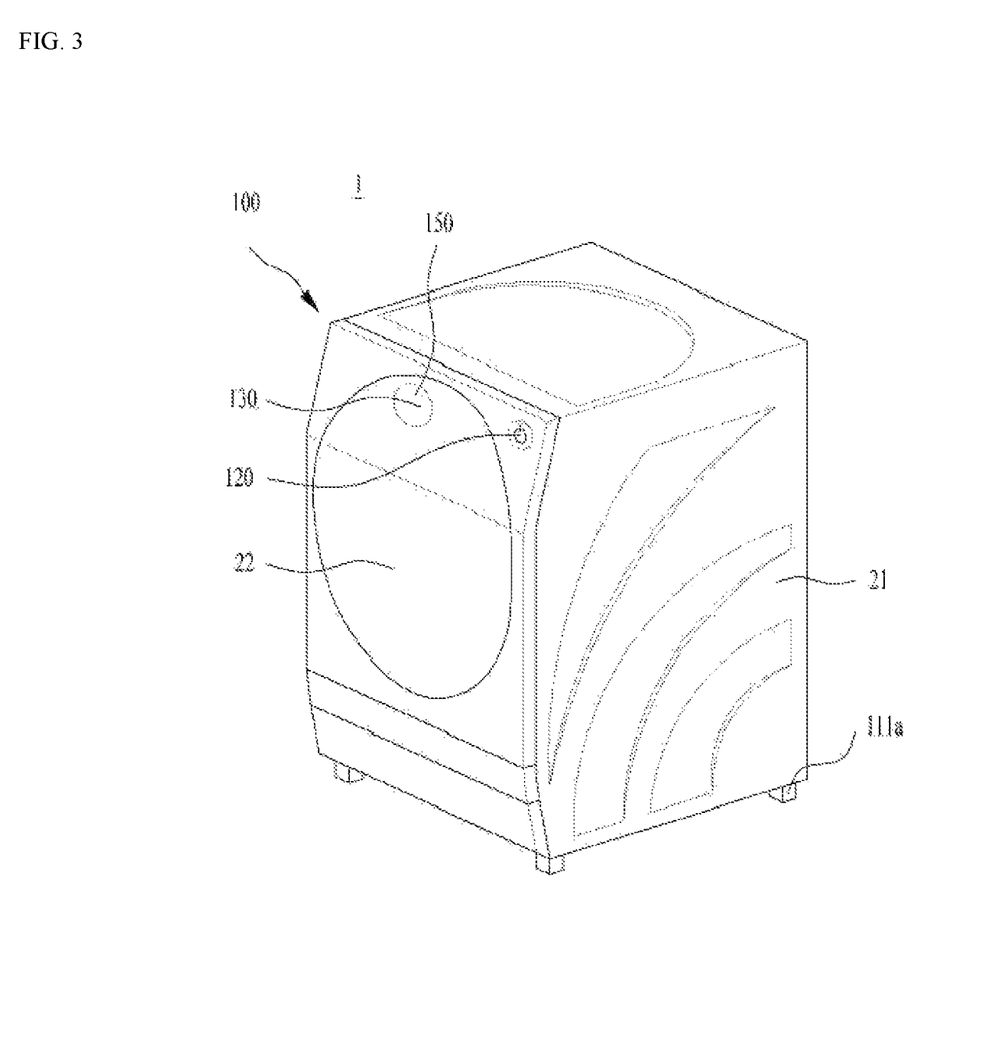
FIG. 3 is a perspective view of a laundry treating apparatus according to an embodiment of the present disclosure.
Figure 4:
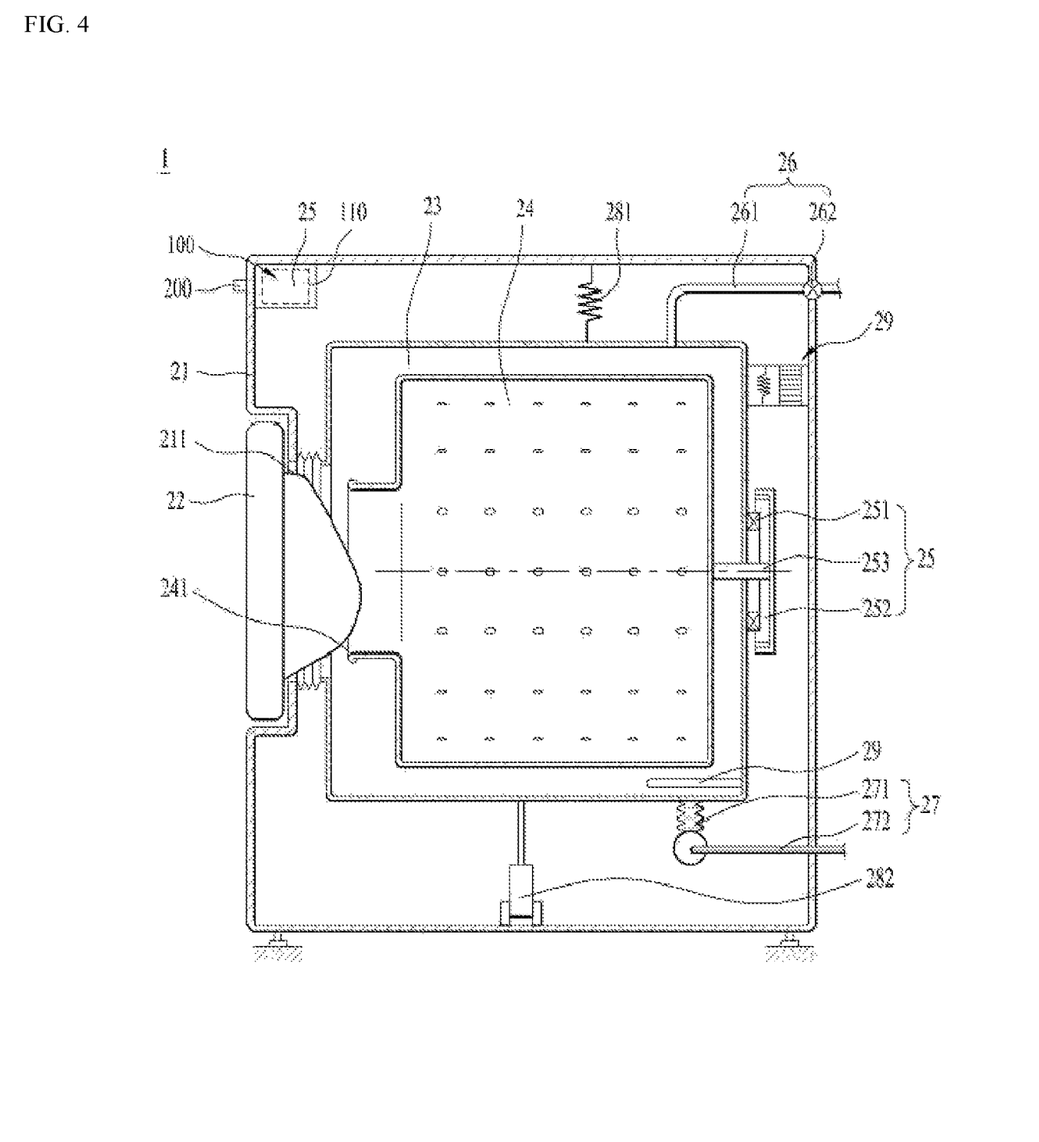
FIG. 4 is an internal cross-sectional view of a laundry treating apparatus according to an embodiment of the present disclosure.

FIG. 3 is a perspective view of a laundry treating apparatus 1 according to an embodiment of the present disclosure, and FIG. 4 shows an internal structure a laundry treating apparatus.

Referring to FIGS. 3 and 4, the laundry treating apparatus 1 according to an embodiment of the present disclosure may include a cabinet 21 that has a laundry inlet 211 defined therein into which laundry is put and forms an appearance of the laundry treating apparatus 1, and a door 22 that opens and closes the laundry inlet 211.

In addition, the laundry treating apparatus of the present disclosure may be constructed as a front load type laundry treating apparatus in which the laundry inlet 211 and the door 22 are defined in and formed on a front surface of the cabinet 21. However, this is only an embodiment of the present disclosure. The present disclosure may include various types of laundry treating apparatus such as a top load type in which the laundry inlet and the door are defined in and formed on a top surface of the cabinet as well as the front load type.

In addition, the laundry treating apparatus of the present disclosure may include a control panel 100 that receives, displays, or executes a series of operation commands. The operation command may be an arbitrary course or option set such that a washing cycle of removing foreign substances from the laundry, or a drying cycle of removing moisture from the laundry is performed.

A controller 110 that controls all components of the laundry treating apparatus to perform the arbitrary course or option may be installed in the control panel 100.

The arbitrary course or option that provides a series of control methods capable of performing at least one of the washing cycle of removing the foreign substances from the laundry and the drying cycle of drying the laundry containing the moisture may be pre-stored in the controller 110.

When the laundry treating apparatus 1 is a washing machine, the arbitrary course may be a combination of at least one of a washing operation of removing the foreign substances from the laundry, a rinsing operation of separating the foreign substances from the laundry and a detergent, and a dehydration operation of removing the moisture from the laundry. In addition, when the laundry treating apparatus 1 is a dryer, the arbitrary option may be a plurality of drying operations of removing the moisture from the laundry.

In one example, the controller 110 may further include an arbitrary option of changing additional conditions of the course when performing the course.

When the laundry treating apparatus 1 is the washing machine, the arbitrary option may be a series of control methods for adjusting at least one of the numbers of washing operation, rinsing operation, and dehydration operation, a drum rotation speed when performing each operation, a ratio of a time a drum rotates for a certain time (actual operation rate), an opening time of a water supply valve or an amount of water (water level), an amount of electricity used, a water temperature, whether steam is supplied, and a duration of each operation.

When the laundry treating apparatus 1 is the dryer, the arbitrary option may be a series of control methods for adjusting at least one of the number of drying operation, a drum rotation speed when performing the drying operation, a ratio of a time a drum rotates for a certain time (actual operation rate), an amount of electricity used, whether steam is supplied, and a duration of the drying operation.

In one example, the control panel 100 may include a display 130 that displays a state of the laundry treating apparatus 1, a power supply 120 that inputs power to the laundry treating apparatus, and a control unit 150 that receives a command for driving the laundry treating apparatus.

In addition, a portion of the control panel 100 may be constructed as a touch display device, so that the functions of the display 130 and the control unit 150 may be simultaneously implemented on one display device. However, the present disclosure may not be limited thereto, and the display 130 and the control unit 150 may be disposed at separate positions.

Referring to FIG. 4, the laundry treating apparatus 1 according to an embodiment of the present disclosure includes the cabinet 21 that forms the appearance of the laundry treating apparatus 1 and has the laundry inlet defined therein, and a drum 24 that is disposed inside the cabinet 21, has a drum opening 241 defined therein in communication with the laundry inlet 211, and accommodates the laundry therein. In addition, the laundry treating apparatus 1 includes the control unit 150 that is disposed on the cabinet 21 and sets a scheme of handling the laundry.

In addition, the laundry treating apparatus 1 according to an embodiment of the present disclosure may include a laundry accommodating portion that is defined inside the cabinet and accommodates the laundry therein.

When the laundry treating apparatus is the washing machine, the laundry accommodating portion may include a tub 23 that is disposed inside the cabinet 21 and stores water therein, and the drum 24 rotatably disposed in the tub 23.

In addition, the laundry treating apparatus 1 of the present disclosure may include a driver 25 coupled to the tub 23 to rotate the drum 24, a water supply 26 that supplies water to the tub 23, and a drainage 27 that drains the water of the tub 23.

In one example, when the laundry treating apparatus 1 is the dryer, the laundry accommodating portion may include only the drum 24 rotatably disposed inside the cabinet 21.

In addition, the laundry treating apparatus 1 of the present disclosure may further include a hot air supply or heater 29 that supplies hot air to the tub 23, and may include the door 22 that opens and closes an inlet of the tub 23 and the opening of the cabinet 21.

The water supply 26 may include a water supply valve 262 and a water supply pipe 261, and the drainage 27 may include a drainage pump 271 and a drainage pipe 272.

The driver 25 may include a stator 251 that is coupled to the tub 23 to generate a rotating magnetic field, a rotor 252 that rotates by the rotating magnetic field, and a rotation shaft 253 that rotates together with the rotor 252 to rotate the drum 24.

The tub 23 may be supported in the cabinet 21 by a support while vibration is damping. The support may include a damper 282 and a spring 281 that may connect the cabinet 21 and the tub 23 to each other to damp the vibration.

The driver 25, the water supply 26, the drainage 27, the hot air supply and the heater 29 may repeat driving and stopping based on at least one of the courses and options set in the control panel 100 or the controller 110 of the laundry treating apparatus.

For example, the water supply valve 262 may be opened, the driver 25 may be rotated, and the drainage pump 271 may be operated based on an input course and option.

In one example, the laundry treating apparatus 1 of the present disclosure may further include a communication module (not shown) capable of communicating with at least one of a server and an external terminal.

The present disclosure is not limited to the laundry treating apparatus of the form shown in FIG. 4. A laundry treating apparatus that may have a control unit to be described later may be applied to various laundry treating apparatuses including the washing machine and the dryer.

Figure 5:
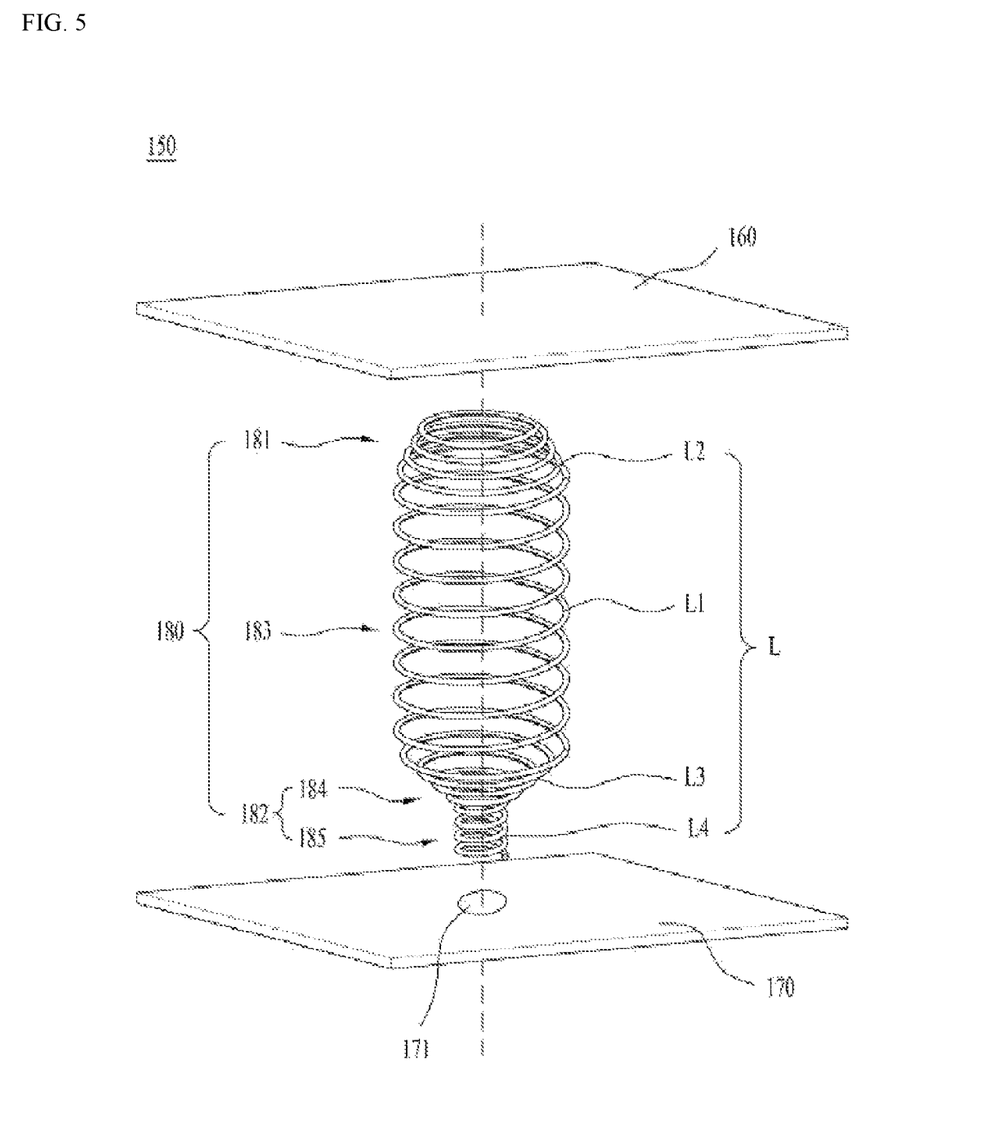
FIG. 5 is an exploded perspective view of an interior of a control unit of a laundry treating apparatus according to an embodiment of the present disclosure.
Figure 6:
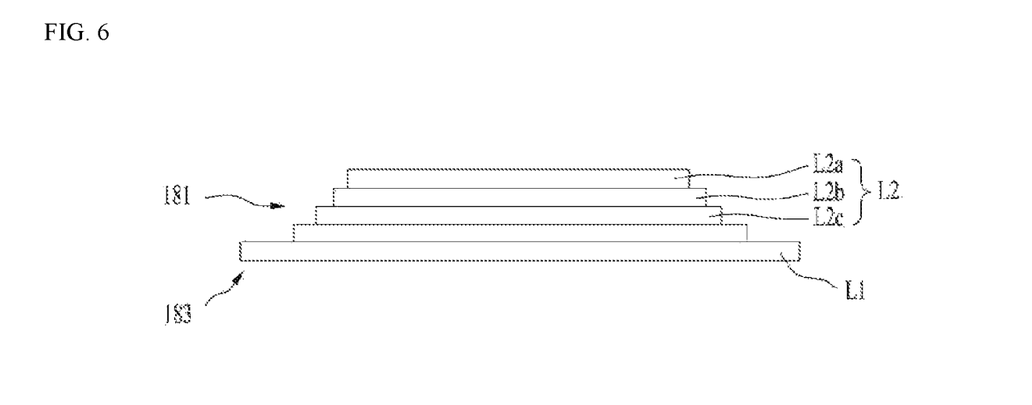
FIG. 6 is a side view of a spring unit of a laundry treating apparatus according to an embodiment of the present disclosure.
Figure 7:
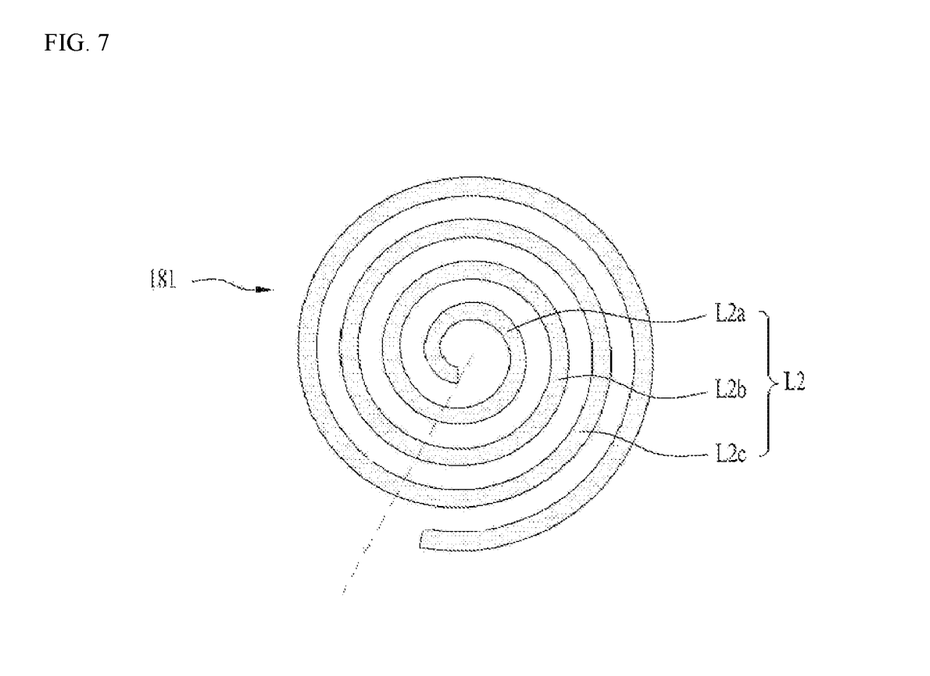
FIG. 7 is a top view of a touch spring of a laundry treating apparatus according to an embodiment of the present disclosure.
Figure 8:
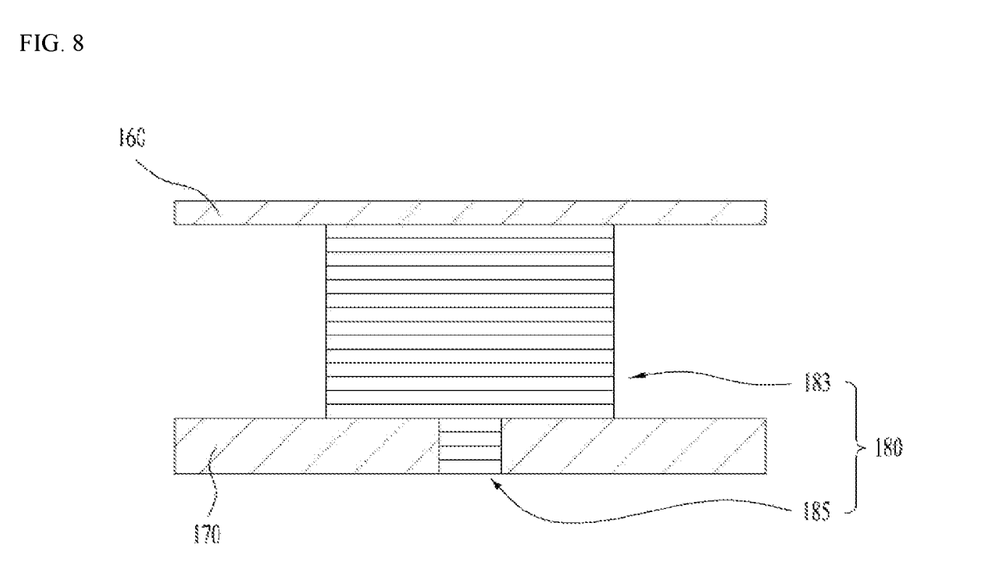
FIG. 8 is a side view showing a state in which a control unit of a laundry treating apparatus according to an embodiment of the present disclosure is coupled.

FIG. 5 shows an internal structure of a control unit of a laundry treating apparatus according to an embodiment of the present disclosure. FIG. 6 is a view showing a spring unit viewed from the side. FIG. 7 is a view showing a touch spring viewed from the top. FIG. 8 is a side view showing a state in which a spring unit is coupled between a touch portion and a circuit.

Referring to FIG. 5, the control unit 150 includes a touch portion 160 that forms an exposed surface outwardly of the cabinet 21, and a circuit (e.g., a circuit board) 170 spaced apart from the touch portion 160 and positioned inside the cabinet 21. In addition, the control unit 150 includes a spring unit 180 that has one end in contact with the touch portion 160 and the other end coupled to the circuit 170 to connect the touch portion 160 and the circuit 170 to each other, and transmits an electrical signal of the touch portion 160 to the circuit 170.

The touch portion 160 may form the exposed surface of the control unit 150 in FIG. 3. Accordingly, the user may control the laundry treating apparatus in a scheme of touching the touch portion 160, and an input of the touch portion 160 may be transmitted to the controller 110 through the spring unit 180 and the circuit 170 positioned inside the cabinet 21. The controller 110 may receive the input of the touch portion 160 to control an operation of the laundry treating apparatus.

The spring unit 180 may include a touch spring 181 in contact with the touch portion 160, a circuit spring 182 coupled to the circuit 170, and a connection spring 183 that connects the touch spring 181 and the circuit spring 182 to each other. In addition, diameters of the touch spring 181 and the circuit spring 182 may be the same as a diameter of the connection spring 183 or smaller than the diameter of the connection spring 183.

The spring unit 180 performs a function of transmitting an electrical signal generated by a touch to the circuit 170 composed of a PCB substrate when the user touches the touch portion 160 to directly perform a touch operation. The spring unit 180 may be manufactured in a form in which a single spring wire L made of a metal material extends while turning to form continuous circles. In other words, the spring unit 180 may be formed in a helix shape extends while turning in a three-dimensional space. The spring wire L constituting the spring unit 180 may be made of an electrical conductor material.

The material of the metal line may be various conductors, such as copper, aluminum, and silver, and conductor alloys. However, the present disclosure may not be limited to the above-mentioned materials, and various materials may be applied as long as it is a material that may implement the touch panel by electrically connecting the touch portion 160 and the circuit 170 to each other.

The circuit 170 may have a circuit through-hole 171 penetrating the circuit. Generally, a hole into which an electrode of a component is inserted is defined in a PCB substrate. The circuit through-hole 171 may mean a hole defined in the general PCB. The circuit through-hole 171 may have a circular cross-section, and a copper foil may be disposed along a perimeter of the circuit through-hole 171 on one surface of the circuit 170 in a direction in which the component is inserted. The spring unit 180 may be coupled to be in contact with the copper foil to transmit a change in capacitance occurred in the touch portion 160 resulted from the control of the user to the circuit 170.

A portion of the circuit spring 182 may be inserted into the circuit through-hole 171, and the circuit spring 182 inserted into the circuit through-hole 171 and exposed to a rear surface of the circuit 170 may be coupled to the circuit 170 through a scheme such as soldering.

In addition, the circuit spring 182 and a top surface of the circuit 170 may also be coupled to each other through a reflow scheme. The circuit spring 182 and a top surface of the circuit 170 may be coupled to each other in a scheme in which a material requiring bonding is applied in advance onto an upper end of the circuit 170 to be in contact with the circuit spring 182, and heat is applied to the material after compressing the spring unit 180.

A scheme in which the circuit spring 182 is coupled to the circuit 170 may not be limited to the above-described coupling scheme, and only a portion of the top and rear surfaces of the circuit 170 may be fixed, or both surfaces thereof may be fixed. Various methods may be applied to the fixing and coupling method as long as the spring unit 180 and the circuit 170 may be electrically coupled to each other.

Referring to FIG. 5, the touch spring 181 may extends helically from the connection spring 183 in a direction away from the circuit spring 182, and a diameter thereof may decrease as the touch spring 181 extends. That is, the touch spring 181 may be formed in the shape of the helix extending helically in the three-dimensional space, and the diameter of the touch spring 181 may vary along a longitudinal direction of the spring unit 180. In other words, the touch spring 181 may decrease in diameter as it approaches the rear surface of the touch portion 160 from the connection spring 183.

In addition, referring to FIG. 6, when the touch spring 181 is viewed from the side, the touch spring 181 may have a pyramid shape in which the diameter thereof viewed from the side decreases as the touch spring 181 extends toward the touch portion 160.

The touch spring 181 may maintain a shape protruding from the connection spring 183 in a height direction of the spring unit 180 in an uncompressed state, that is, in a state in which an external force is not applied thereto. However, when being compressed between and coupled to the touch portion 160 and the circuit 170, that is, when the external force of compressing the touch spring 181 in the height direction of the spring unit 180 is applied thereto, an entirety of the touch spring 181 may be located on the same line when viewed from the side. In other words, the touch spring 181 may be in close contact with the rear surface of the touch portion 160.

However, the present disclosure is not limited thereto. When a surface of the touch spring 181 in contact with the rear surface of the touch portion 160 forms a curved surface, the touch spring may be compressed into a shape corresponding to the corresponding curved surface, and may be coupled to the rear surface of the touch portion 160 such that the entirety of the touch spring is disposed on one curved line.

Referring to FIG. 7, the touch spring 181 may be formed in a form in which the metal line forming the connection spring 183 is extended and is gradually rolled inwardly in the helix shape, when viewed from the top.

As described above, when the touch spring 181 is compressed in close contact with the rear surface of the touch portion 160, a ratio of contact with the touch portion 160 within the same area may be increased. In addition, because the touch spring 181 extends in the form of decreasing diameter, it is possible to implement a touch button in an area smaller than the diameter of the connection spring 183. Accordingly, more touch buttons may be implemented in the touch portion 160. When more touch buttons are implemented, the user is able to control the laundry treating apparatus in more detail, and usability of the laundry treating apparatus is increased.

In addition, because it is possible to implement all of existing touch buttons in a smaller touch portion 160, there is also an effect of miniaturizing the touch panel of the laundry treating apparatus.

The touch spring 181 may be formed by a second spring wire L2 extending from a first spring wire L1 forming the connection spring 183 to form the helical shape. That is, one spring wire L may extend, and a portion thereof may form the connection spring 183, and another portion thereof may form the touch spring 181.

As such, one spring wire L may form the entire spring unit 180, and the portion thereof forming the connection spring 183 may be referred to as the first spring wire L1, and another portion thereof may be referred to as the second spring wire L2 or a third spring wire L3.

The second spring wire L2 may extend in the direction away from the connection spring 183, and may extend toward the touch portion 160 while forming the helical shape. In the second spring wire L2 that forms the helical shape, portions adjacent to each other in a radial direction of the touch spring 181 may be formed to be spaced apart from each other in the radial direction of the touch spring 181.

That is, referring to FIG. 7, when the second spring wire L2 extends while rotating in the helical shape, every portion forming 360 degrees may be successively named as a first section L2a, a second section L2b, and a third section L2c. The section number may be successively added continuously. In this connection, the second section L2b may be formed radially outward of the first section L2a and formed radially inward of the third section L2c. In other words, the first section L2a may be positioned so as not to overlap with the second section L2b that surrounds the first section L2a when compressed, and the third section L2c may be positioned to surround the second section L2b when compressed, but so as not to overlap with the second section L2b.

When the touch spring 181 is formed as described above, when the touch spring 181 is compressed by the touch portion 160, it is possible to prevent a decrease in an area in contact with the touch portion 160 resulted from the adjacent portions of the second spring wire L2 overlapping with each other.

That is, the contact area between the touch spring 181 and the touch portion 160 may be increased. The portions of the second spring wire L2 that constitute the entirety of the touch spring 181, such as the first section L2a, the second section L2b, the third section L2c, and the like may be in contact with the touch portion 160 without overlapping with each other. When the portions of the second spring wire L2 are in contact with the touch portion 160 as such, the contact area between the touch portion 160 and the touch spring 181 may be increased. As the contact area increases, touch sensitivity and accuracy of the touch portion 160 may be improved. Accordingly, there is an effect that the usability of the laundry treating apparatus is increased and the accuracy and stability are improved.

When the second spring wire L2 is compressed by the touch portion 160, an entirety of one surface of the second spring wire L2 facing the touch portion 160 may be in contact with the touch portion 160. This may mean that all sections of the second spring wire L2 that forms the touch spring 181, such as the first section L2a, the second section L2b, the third section L2c, and the like that are successively formed by the second spring wire L2, are formed to be in contact with the touch portion 160 without the adjacent sections overlapping with each other.

When the second spring wire L2 is a metal line having a circular cross-section, the second spring wire L2 may be in line contact with the touch portion 160 when compressed by the touch portion 160. In this connection, 'one surface of the second spring wire L2 facing the touch portion 160' may mean one line connecting contact points of the second spring wire L2 in contact with the touch portion 160 to each other.

In addition, when the second spring wire L2 is compressed and deformed and is in surface contact with the touch portion 160, 'one surface of the second spring wire L2 facing the touch portion 160' may be used to mean all surfaces of the second spring wire L2 that are in surface contact with the touch portion 160.

That is, this may be used to mean a portion of the second spring wire L2 that may face and be in contact with the touch portion 160.

When the touch spring 181 is formed as described above, the contact ratio may increase within the same area. When the contact ratio increases, the effect of increasing the sensitivity, stability and reliability of the touch may be obtained.

In one example, the circuit spring 182 extending from the connection spring 183 may be formed at a lower portion of the spring unit 180. The circuit spring 182 may extend in a helix shape in a direction away from the touch spring 181 from the connection spring 183, and a diameter thereof may be reduced as the circuit spring 182 extends.

That is, the circuit spring 182 may extend from the connection spring 183 in the helix shape, and extend such that the diameter thereof decreases as the circuit spring 182 extends, and then increases to a certain diameter again.

In addition, the circuit spring 182 may include a contact spring 184 in contact with one surface of the circuit 170 facing the touch portion 160, and an insertion spring 185 that extends in the direction away from the touch spring 181 from the contact spring 184, and is inserted into and fixed in the circuit through-hole 171.

The contact spring 184 may extend in a shape in which a diameter thereof gradually decreases, and the insertion spring 185 may extend in a helix shape having a constant diameter.

The contact spring 184 may be manufactured in a form similar to that of the touch spring 181. As previously described for the touch spring 181, the contact spring 184 may be manufactured to extend in the direction away from the touch spring 181 from the connection spring 183, and to gradually decreases in diameter while forming the helix shape.

That is, when the touch spring 181 is manufactured in the pyramid shape when viewed from the side, the contact spring 184 may be manufactured in an inverted pyramid shape.

The contact spring 184 may maintain a shape protruding from the connection spring 183 in the direction away from the touch spring 181 in an uncompressed state, but may be compressed such that an entirety thereof is located on the same plane when being in contact with the circuit 170 and being compressed.

However, the present disclosure may not be limited to the entirety of the contact spring 184 being positioned on the same plane. When one surface of the circuit 170 to which the contact spring 184 is contacted and compressed forms a curved surface, the contact spring 184 may be compressed in a form corresponding to the curved surface, and a density of the contact spring 184 in contact with the circuit 170 may be improved.

The contact spring 184 may be in contact with the copper foil formed along the perimeter of the circuit through-hole 171 on said one surface of the circuit 170. As the density of the contact spring 184 in contact with the copper foil is improved, the contact spring 184 may better transmit the electrical signal to the circuit 170. Therefore, the electrical signal such as the change in the capacitance occurred by the touch control of the user may be more stably transmitted to the touch portion 160, so that the usability and stability of the laundry treating apparatus are increased.

As described above, the contact spring 184 may be formed by the third spring wire L3 extending from the first spring wire L1 forming the connection spring 183 to form the helix shape.

That is, one spring wire may extend, and a portion thereof may form the connection spring 183, another portion thereof may form the touch spring 181, and still another portion thereof may form the contact spring 184. As such, one metal line may form the entire spring unit 180, and the portion thereof forming the connection spring 183 may be referred to as the first spring wire L1, the portion thereof forming the touch spring 181 may be referred to as the second spring wire L2, and the portion thereof located on a side of the second spring wire L2 opposite to the first spring wire L1 may be referred to as the third spring wire L3. In addition, a portion extending from the third spring wire L3 to form the insertion spring 185 may be referred to as a fourth spring wire L4.

The contact spring 184 may be formed by the third spring wire L3 that extends from the first spring wire L1 forming the connection spring 183 to form the helix shape, and portions of the third spring wire L3 adjacent to each other in a radial direction of the contact spring 184 may be formed to be spaced apart from each other in the radial direction of the contact spring 184.

When the portions of the third spring wire L3 adjacent to each other in the radial direction are formed to be spaced apart from each other in the radial direction, the contact spring 184 may increase in a contact area with the circuit 170 while being pressed by the circuit 170 as in the relationship between the touch spring 181 and the touch portion 160 described above.

In an assembly operation of the control unit 150, an adhesive or the like may be applied to the portion where the contact spring 184 and the circuit 170 are in contact with each other. The adhesive may have a property of bringing both members into contact with each other as a state thereof is changed when heat is applied thereto. Therefore, the spring unit 180 and the circuit 170 may be coupled to each other in a scheme of applying the adhesive to one surface of the circuit 170, then compressing the spring unit 180 to allow the contact spring 184 and the circuit 170 to be in close contact with each other, and then, applying the heat. It is possible to firmly couple the spring unit 180 to the circuit 170 in such a reflow scheme.

In addition, the third spring wire L3 may be constructed such that an entirety of one surface of the third spring wire L3 facing the circuit 170 is in contact with the circuit 170 when compressed by the circuit 170. That is, this may mean that portions of the third spring wire L3 do not overlap with each other and the entirety of the third spring wire L3 is in contact with the circuit 170 to increase a contact density when the third spring wire L3 is compressed by the circuit 170.

In this connection, when a cross-section of the third spring wire L3 has a circular shape, 'one surface of the third spring wire L3' may mean a specific line in contact with the plane. When the third spring wire L3 is deformed by a compressive force and is in surface contact with the circuit 170, 'one surface of the third spring wire L3' may mean the corresponding contact surface.

In one example, a diameter of the insertion spring 185 may be the same as or smaller than a diameter of the circuit through-hole 171, and a height of the insertion spring 185 may be the same as or greater than a depth of the circuit through-hole 171.

The insertion spring 185 may be formed by the fourth spring wire L4. The fourth spring wire L4 may turn to have the same diameter and extend in a direction away from the contact spring 184.

Even when the insertion spring 185 is formed to have the same diameter as the circuit through-hole 171, because the insertion spring 185 is made of a material that may be deformed, the insertion spring 185 may be deformed while being compressed by the circuit through-hole 171, and be inserted into the circuit through-hole 171.

However, when the diameter of the insertion spring 185 is smaller than the diameter of the circuit through-hole 171, the spring unit 180 may be more easily coupled to the circuit 170. After the insertion, another coupling member or coupling method may be used to firmly fix the spring unit 180.

In addition, when the length of the insertion spring 185 is greater than the depth of the circuit through-hole 171, an end of the insertion spring 185 may protrude to the opposite side of the circuit 170. The spring unit 180 may be firmly fixed in a scheme of soldering the end of the protruding insertion spring 185 to the circuit 170. However, the coupling method may not be limited to the soldering, and any method may be used as long as it is a method of fixing components to the circuit.

In one example, the contact spring 184 constituting the circuit spring 182 may be fixed to be in contact with the circuit 170, and the insertion spring 185 may be fixed by being inserted into the circuit through-hole 171. This may mean that the contact spring 184 and the circuit 170 are coupled to each other by the reflow scheme, and the insertion spring 185 is inserted into the circuit through-hole 171 and firmly fixed through the scheme such as the soldering, as described above.

As the circuit spring 182 is fixedly coupled to both surfaces of the circuit 170 as such, a coupling force may be increased. When the coupling of the spring unit 180 improves, the reliability and the stability of the touch are improved when the user performs the touch control on the control unit 150.

The connection spring 183 may connect the touch spring 181 and the circuit spring 182 to each other while maintaining the same diameter. That is, the first spring wire L1 forming the connection spring 183 may extend while turning to have the same diameter unlike the second spring wire L2 or the third spring wire L3.

The connection spring 183 not only performs the function of electrically connecting the touch spring 181 and the circuit spring 182 to each other, but also performs a role of maintaining a shape of the entire spring unit 180 by being compressed between the circuit 170 and the touch portion 160.

However, when the connection spring 183 extends in the helix shape without maintaining the constant diameter, the connection spring 183 may be compressed without maintaining the shape thereof, thereby reducing structural stability.

Therefore, when the connection spring 183 extends with the constant diameter, the connection spring 183 may more firmly maintain the shape thereof. That is, the first spring wire L1 forming the connection spring 183 may maintain a cylindrical shape while portions thereof adjacent to each other in the height direction support each other's load or compressive force. In other words, when the diameter of the connection spring 183 is maintained the same, the shape of the spring unit 180 may be maintained to improve the structural stability of the control unit 150.

Referring to FIG. 8, a side view of the state in which the spring unit 180 is disposed between and coupled to the touch portion 160 and the circuit 170 may be identified.

In FIG. 8, the exposed surface of the touch portion 160 is located at the top. However, the present disclosure may not be limited thereto, and the exposed surface of the touch portion 160 may be directed in the direction in which the laundry inlet 211 is defined or may be directed in various directions based on a design of the laundry treating apparatus. For convenience of description, the coupling state will be described with reference to FIG. 8, and the actual embodiment is not limited to the drawing.

When the side view showing the shape in which the spring unit 180 is disposed between and coupled to the touch portion 160 and the circuit 170 is shown as in FIG. 8, the touch spring 181 and the contact spring 184 may be compressed and located inside the connection spring 183.

That is, the touch spring 181 and the contact spring 184, which are in a form of decreasing diameter in the direction away from the connection spring 183, may be compressed in the height direction of the spring unit 180, and respectively located on the contact surfaces thereof with the touch portion 160 and the circuit 170. That is, when viewed from the side, each of the touch spring 181 and the contact spring 184 may be located on the same straight line with each of the contact surfaces with the touch portion 160 and the circuit 170.

However, the present disclosure may not be limited thereto. When the touch portion 160 or the circuit 170 is in the curved surface shape, the touch portion 160 or the circuit 170 may be positioned on the same curved line rather than the same straight line when viewed from the side.

Because FIG. 8 shows the state in which the touch spring 181 and the contact spring 184 are respectively in contact with the touch portion 160 and the circuit 170 and compressed to be located inside the connection spring 183, the touch spring 181 and the contact spring 184 are not shown in the drawing.

In addition, the insertion spring 185 may be inserted into and coupled to the circuit through-hole 171. Referring to FIG. 8, which is the side view, the insertion spring 185 appears as if it extends directly from the connection spring 183. However, in reality, the contact spring 184 is not shown because it is located inside the connection spring 183, so that the insertion spring 185 is inserted into the circuit through-hole 171 by being extended from the contact spring 184 located inside the connection spring 183.

The contact spring 184 may be firmly coupled to the circuit 170 by the bonding material on the surface thereof in contact with the circuit 170 as described above. The corresponding coupling portion may also be located inside the connection spring 183.

In addition, the insertion spring 185 inserted into the circuit through-hole 171 may have the length greater than the length of the circuit through-hole 171 to protrude from one surface of the circuit 170. The protruding portion of the insertion spring 185 may be fixed to the circuit 170 in the scheme such as the soldering or the like using the bonding material.

As shown in FIG. 8, the connection spring 183 may be formed to have the constant diameter. When the connection spring 183 continues to extend with the same diameter, because a supporting force is generated between the portions of the first spring wire L1 adjacent to each other in the height direction, the connection spring 183 may maintain the cylindrical shape and the structural stability of the entirety of the control unit 150 may be secured.

Although the present disclosure has been illustrated and described in relation to the specific embodiment, it will be apparent to those of ordinary skill in the art that the present disclosure may be variously improved and changed within the limits that do not depart from the technical spirit of the present disclosure provided by the following claims.

What is claimed is:

1. A laundry treating apparatus comprising:
    a cabinet that defines an appearance of the laundry treating apparatus, the cabinet defining a laundry inlet;
    a drum disposed inside the cabinet, the drum defining a drum opening that is configured to receive laundry through the laundry inlet; and
    a control unit disposed at the cabinet and configured to receive an input,
    wherein the control unit comprises:
        a touch portion that defines at least a portion of an exposed surface of the laundry treating apparatus, the touch portion being configured to receive the input,
        a circuit board spaced apart from the touch portion and disposed inside the cabinet, and a spring unit that connects the touch portion to the circuit board and is configured to transmit an electrical signal corresponding to the input from the touch portion to the circuit board, the spring unit having a first portion in contact with the touch portion and a second portion coupled to the circuit board.

2. The laundry treating apparatus of claim 1, wherein the spring unit comprises:
   a touch spring in contact with the touch portion;
   a circuit spring coupled to the circuit board; and
   a connection spring that connects the touch spring and the circuit spring to each other, and
   wherein each of a diameter of the touch spring and a diameter of the circuit spring is less than or equal to a diameter of the connection spring.

3. The laundry treating apparatus of claim 2, wherein the circuit board defines a circuit through-hole that passes therethrough, and
   wherein the spring unit is coupled to the circuit through-hole, and the circuit spring is inserted into and fixed to the circuit through-hole.

4. The laundry treating apparatus of claim 3, wherein the touch spring extends in a helix shape from the connection spring in a direction away from the circuit spring, and
   wherein the diameter of the touch spring decreases as the touch spring extends away from the circuit spring.

5. The laundry treating apparatus of claim 4, wherein the connection spring comprises a first spring wire,
   wherein the touch spring comprises a second spring wire that extends from the first spring wire in the helix shape, and
   wherein portions of the second spring wire face each other in a radial direction, the portions of the second spring wire being spaced apart from each other in the radial direction.

6. The laundry treating apparatus of claim 5, wherein the second spring wire is configured to define a single surface that faces and contacts the touch portion based the second spring wire being compressed by the touch portion.

7. The laundry treating apparatus of claim 6, wherein an entire area of the single surface defined by the second spring wire is configured to be in contact with the touch portion.

8. The laundry treating apparatus of claim 3, wherein the circuit spring comprises:
   a contact spring that is in contact with the circuit board and extends in a helix shape from the connection spring in a direction away from the touch spring, a diameter of the contact spring decreasing as the contact spring extends away from the touch spring; and
   an insertion spring that extends from the contact spring in the direction away from the touch spring and is inserted into and fixed to the circuit through-hole.

9. The laundry treating apparatus of claim 8, wherein the connection spring comprises a first spring wire, and the touch spring comprises a second spring wire,
   wherein the contact spring comprises a third spring wire that extends from the first spring wire in the helix shape, and
   wherein portions of the third spring wire face each other in a radial direction, the portions of the third spring wire being spaced apart from each other in the radial direction.

10. The laundry treating apparatus of claim 9, wherein a diameter of the insertion spring is less than or equal to a diameter of the circuit through-hole, and
    wherein a height of the insertion spring is greater than or equal to a depth of the circuit through-hole.

11. The laundry treating apparatus of claim 9, wherein the third spring wire is configured to define a single surface that faces and contacts the circuit board based on the third spring wire being compressed by the circuit board.

12. The laundry treating apparatus of claim 11, wherein an entire area of the single surface defined by the third spring wire is configured to be in contact with the circuit board.

13. The laundry treating apparatus of claim 9, wherein the contact spring is fixed to and in contact with the circuit board, and
    wherein the insertion spring is inserted into and fixed to the circuit through-hole.

14. The laundry treating apparatus of claim 2, wherein the connection spring is located between the touch spring and the circuit spring, and
    wherein the diameter of the connection spring is constant.

15. The laundry treating apparatus of claim 1, further comprising a door disposed at a front surface of the cabinet and configured to cover the laundry inlet, and
    wherein the touch portion is disposed at the door.

16. The laundry treating apparatus of claim 1, wherein the touch portion is disposed at a surface of the cabinet and extends parallel to the circuit board.

17. The laundry treating apparatus of claim 1, wherein the spring unit is made of metal and electrically connects the touch portion and the circuit board to each other.

18. The laundry treating apparatus of claim 2, wherein each of the diameter of the touch spring and the diameter of the circuit spring is less than the diameter of the connection spring, and
    wherein the connection spring is configured to surround circumferences of the touch spring and the circuit spring based on the touch portion being pressed toward the circuit board.

19. The laundry treating apparatus of claim 1, wherein the spring unit is configured to be compressed and extended along an axis perpendicular to the touch portion,
    wherein the spring unit further comprises a third portion disposed between the first portion and the second portion, and
    wherein a length of the third portion along the axis is greater than each of a length of the first portion and a length of the second portion along the axis.

20. The laundry treating apparatus of claim 19, wherein a diameter of the third portion is greater than or equal to each of a diameter of the first portion and a diameter of the second portion.

* * * * *